United States Patent [19]

Uchida et al.

[11] Patent Number: 4,491,802
[45] Date of Patent: Jan. 1, 1985

[54] WIDE-BAND AMPLIFIER SYSTEM

[75] Inventors: Kozo Uchida, Akikawa; Keishi Matsuno, Hino, both of Japan

[73] Assignee: Iwatsu Electric Co., Ltd., Tokyo, Japan

[21] Appl. No.: 388,166

[22] Filed: Jun. 14, 1982

[30] Foreign Application Priority Data

Jun. 24, 1981 [JP] Japan .................................. 56-97650

[51] Int. Cl.³ .............................................. H03F 1/34
[52] U.S. Cl. ...................................... 330/260; 330/85; 330/107; 330/256; 330/261; 330/294; 330/311
[58] Field of Search .................. 330/85, 107, 126, 151, 330/69, 260, 261, 256, 294, 311

[56] References Cited

U.S. PATENT DOCUMENTS 3,693,108  9/1971  Iijima et al. ...................... 330/126 X
3,768,028  10/1973 Wolcott et al. .................. 330/151 X
3,889,060  6/1975  Goto et al. ......................... 330/85 X Primary Examiner—James B. Mullins
Attorney, Agent, or Firm—Woodcock Washburn Kurtz Mackiewicz & Norris

[57] ABSTRACT

A system suitable for the amplification of wide-band signals, with frequencies from zero to the gigahertz order, for oscilloscopic observation or recording. Included are first and second amplifier circuits. The first amplifier circuit, typically of multistage configuration, has two inputs, one for the reception of a wide-band signal to be amplified and the other for the reception of a low-band signal, and puts out an amplified wide-band signal in response to the wide- and low-band input signals. Comprising an operational amplifier, the second amplifier circuit also has two inputs for the reception of the low-frequency components of the wide-band input and output signals of the first amplifier circuit and, in response to these inputs, produces the low-band signal for delivery to the mentioned other input of the first amplifier circuit. The second amplifier circuit may produce the low-band signal from either the difference between, or the sum of, the low-frequency components of the wide-band input and output signals.

9 Claims, 6 Drawing Figures

WIDE-BAND AMPLIFIER SYSTEM

BACKGROUND OF THE INVENTION

Our invention relates to amplifiers in general and, in particular, to a broad-band amplifier system having essentially flat response over a frequency range of, say, from zero (direct current) to the order of gigahertz (GHz). The amplifier system of our invention is particularly well adapted for use with oscilloscopes or oscillographs, among other applications.

An amplifier system for wide-band cathode-ray oscilloscopes normally consists of a preamplifier and a main amplifier. The preamplifier has provisions for gain control, polarity switching, etc. The main amplifier, on the other hand, offers high gain to amplify the signal sufficiently to drive the cathode-ray tube. The input impedance of such oscilloscopes is usually set at one megaohm, but that of 50 ohms is more common for sampling oscilloscopes and wide-band oscilloscopes covering frequencies up to several hundred megahertz (MHz) or more. Such wide-band input signals are usually of such low levels, however, that the gains of the oscilloscope amplifiers available today are mostly insufficient to amplify them to an extent required for their waveform observation. The need has arisen for the added use of wide-band, high-gain amplifiers, particularly for the measurement of electrical quantities in the research and development of optical communications technology and broad-band semiconductor devices.

Wide-band, high-gain amplifiers present an assortment of problems that must be remedied to establish their true utility. These are degradation in the signal-to-noise ratio, oscillation, drift, and the deterioration of performance characteristics, particularly in the case of the multistage connection of wide-band amplifiers.

In the art of optical communications, for example, there has been awaited the advent of wide-band, low-noise, low-drift amplifiers for the waveform observation of optical signals of over 1 Gb/s. The observation of optical signals requires, before amplification, the translation of extremely small light energy into electric signals by means of wide-band, low-noise photodetectors such as p-i-n photodiodes and avalanche photodiodes. This makes it difficult to control the gain of the amplifier system in the manners common with usual oscilloscopes. A sufficiently broad frequency band and high signal-to-noise ratio have been difficult to obtain through gain control by the amplifier itself, as with one- or 10-megaohm-input amplifiers, or in combination with an attenuator. It has also been not easy to make gain control over a wide range without impairment of frequency response.

We are aware of a variety of wide-band amplifiers heretofore suggested and used for the purposes under consideration (two typical ones illustrated in FIGS. 1 to 3 of the drawings attached hereto). Each such conventional device has one or more of such drawbacks as distortion, uneven gain, drift, and expensiveness, as will be later detailed.

SUMMARY OF THE INVENTION

We seek to overcome the listed problems of the prior art and to provide an improved wide-band amplifier system having essentially flat response over a broad range of frequencies.

Stated briefly, the wide-band amplifier system of our invention comprises a first amplifier circuit having a first input for receiving a wide-band input signal, with frequencies from zero to some sufficiently high frequency maximum, from input means of the system, and a second input for receiving a low-band input signal having frequencies from zero to a relatively low-frequency maximum. In response to the wide- and low-band input signals the first amplifier circuit puts out an amplified wide-band output signal. Also included is a second amplifier circuit which puts out the aforesaid low-band signal, for delivery to the second input of the first amplifier circuit, in response to the low-frequency components of the wide-band input and output signals of the first amplifier circuit that have been drived therefrom via respective low-pass filters. The second amplifier circuit may produce the low-band signal from either the difference between, or the sum of, the two inputs.

As is seen from the above summary of the invention, the second amplifier circuit deals with only the low frequencies, from zero to the low-frequency maximum of, say, 100 kHz, included in the wide-band input signal to be amplified. Thus the second amplifier circuit may incorporate an inexpensive low- and narrow-band operational amplifier, thereby contributing to the lower cost of the amplifier system. The feedback of only the low-frequency band, instead of the full band, also solves the problem of oscillation heretofore encountered with wide-band, multistage amplifiers. Moreover, as will be understood from the following disclosure of a preferred embodiment, our invention reduces distortion at low frequencies, affords substantially flat response over the complete frequency range, and minimizes drift in spite of the use of the inexpensive operational amplifier.

In the preferred embodiment the first amplifier circuit takes the form of a multistage transistor amplifier, comprising wide-band transistors for processing the wide-band input signal and low-band transistors for processing the low-band input signal. The use of the low-band transistors also serves to make the amplifier system less expensive than the known one comprising only wide-band transistors in push-pull configuration. Further the transistors of the first amplifier circuit are directly coupled together, with minimal lengths of signal connections, to enable the system to respond to a broader range of frequencies. All in all, the amplifier system of our invention is especially well adapted for use with oscilloscopes notably including synchroscopes and sampling oscilloscopes.

The above and other features and advantages of our invention and the manner of attaining them will become more apparent, and the invention itself will best be understood, from a study of the following description of the preferred embodiment taken in connection with the accompanying drawings.

DETAILED DESCRIPTION

Figure 1:
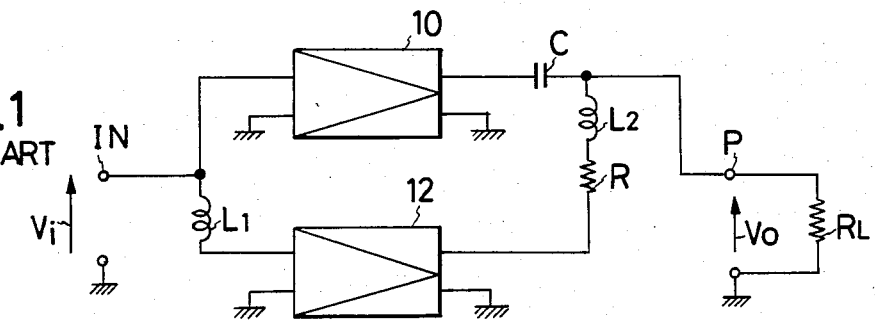
FIG. 1 is a block diagram of a typical conventional wide-band amplifier system.
Figure 2:
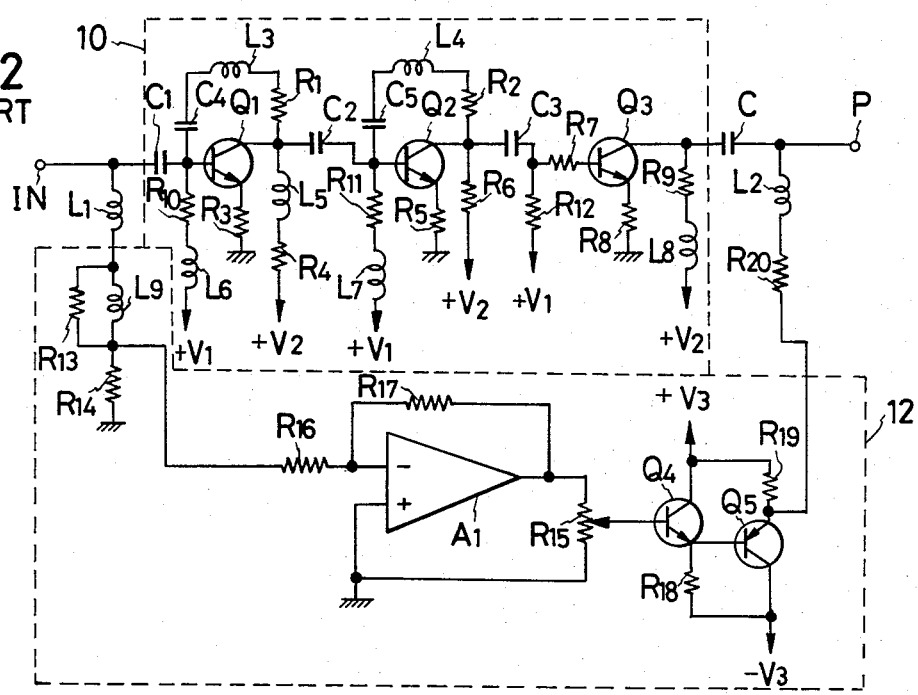
FIG. 2 is a schematic electrical diagram showing the prior art system of FIG. 1 in more detail.
Figure 3:
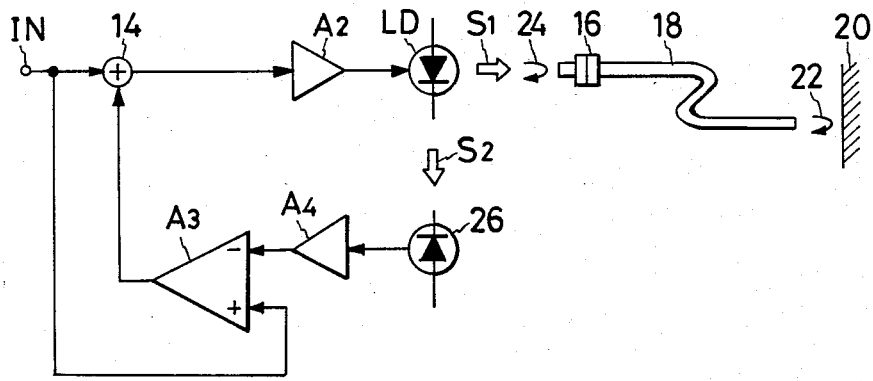
FIG. 3 is a block diagram of another typical conventional wide-band amplifier system.

For further clarification of the problems heretofore encountered in the art of wide-band amplification, we have illustrated some typical conventional systems in FIGS. 1 through 3. FIG. 1 is a block diagram of a "composite" amplifier system incorporating a wide-band AC amplifier 10 for amplification of the high-frequency component of an input signal with a gain $G1(\omega)$, and a DC amplifier 12 for amplification of its low-frequency component with a gain $G2(\omega)$. Also included are a high frequency capacitor C capable of operation over a wide frequency range, an inductor L1 for deriving the low-frequency component from the input signal without affecting its high-frequency component, another inductor 12 for recombining the low-frequency component with the high-frequency component without affecting the latter, and a resistor R. The indicia Vi stand for the voltage of the input signal applied to input terminals IN; Vo for the voltage of the output signal at output terminals P; and RL for the load impedance connected between the output terminals.

Let us assume that the inductors L1 and L2 are short-circuited, that the output impedances of the amplifiers 10 and 12 are both sufficiently low, and that the load impedance RL is sufficiently high. Then the capacitor C and resistor R on the output lines of the amplifiers 10 and 12 make it possible, theoretically, to obtain a gain Go that is constant from DC to a high frequency band, as in the following.

The voltage Vo of the output signal from the amplifier system of FIG. 1 can be expressed as $$V_o = \frac{G2(\omega) + G1(\omega)j\omega RC}{1 + j\omega RC} V_i \qquad (1)$$

The characteristics of the two amplifiers 10 and 12 are combined on both sides of the crossover point where the angular frequency $\omega c$ equals $1/RC$. Let the overall gain of the amplifier system be G (=Vo/Vi). Then, in a sufficiently low frequency band, $\omega RC < 1$; therefore, $G = G2(\omega) = Go$. In a sufficiently high frequency band, on the other hand, $\omega RC > 1$, and so $G = G1(\omega) = Go$. In the neighborhood of the crossover point, $G1 = G2 = Go$. Consequently, from Equation (1), $G = Go$.

In practice, however, it is difficult for the prior art system of FIG. 1 to embody the principles of Equation (1). Contrary to the above assumption the load impedance RL is in fact comparatively low. The system also requires provisions, such as the inductors L1 and L2, for minimizing adverse effects on the high frequency band of the signal in deriving the low frequencies therefrom and in recombining them with the high frequencies. The actual circuit configuration of the FIG. 1 system is therefore very complex.

FIG. 2 is a more detailed representation of the composite wide-band amplifier system of FIG. 1. The parts making up the wide-band AC amplifier 10 and the DC amplifier 12 are herein shown enclosed in respective dashed outlines. It will be noted that the AC amplifier 10 comprises three wide-band n-p-n transistors Q1, Q2 and Q3. These transistors serve as amplifiers, serially connected via coupling capacitors C1, C2 and C3 to pass an alternating current. The DC amplifier 12, on the other hand, comprises a universal operational amplifier A1 and two ordinary transistors Q4 and Q5, one of the n-p-n type and the other of the p-n-p type, to take charge of frequencies from zero to a relatively low maximum.

The n-p-n transistors Q1 and Q2 of the wide-band amplifier 10 form what are called voltage-feedback amplifiers. The transistor Q1 has a feedback path comprising resistor R1 (290 ohms), inductor L3 and capacitor C4. The other transistor Q2 has a similar feedback path comprising resistor R2 (140 ohms), inductor L4 and capacitor C5. Resistors R3 (zero to five ohms) and R4 (150 ohms), and resistors R5 (five ohms) and R6 (270 ohms), determine the gains of the amplifying paths of the respective voltage-feedback amplifiers. The inductor L5 of the first-stage amplifier is intended for peaking in the high frequency band. Serially inserted in the signal path to the base of the transistor Q3, a resistor R7 (20 ohms) serves for the prevention of oscillation. Resistor R8 (20 ohms) and R9 (200 ohms), connected to the emitter and collector, respectively, of the transistor Q3, determine the gain of this final-stage amplifier. However, the magnitude of the collector output voltage of the transistor Q3 depends upon the load connected thereto via the capacitor C. It will also be seen that, coupled via the capacitors C1, C2 and C3, the amplifying transistors Q1, Q2 and Q3 form an inverting amplifier.

The load resistances as taken from the collectors of the first- and second-stage transistors are from about 90 to 100 ohms. As regards the load resistance as viewed from the collector of the third stage transistor Q3, the load impedance (or characteristic impedance) of the signal path connected to the output terminal P is approximately 50 ohms. Consequently the substantial gains of the amplifiers decrease in progression from the first toward the third stage. The system has an overall voltage gain of approximately 22 decibels (dB) and a bandwidth of approximately 3 GHz.

The wide-band AC amplifier 10 incorporates additional resistors R10 (three kohms), R11 (3.4 kohms) and R12 (20 ohms) for biasing purposes. Inductors L6, L7 and L8 function as filters designed to avoid undesired couplings through the biasing power supplies of the three amplifier stages.

Received by the input terminal IN, the wide-band input signal enters the wide-band AC amplifier 10 via the capacitor C1 and also enters the operational amplifier A1 of the DC amplifier 12 via the inductors L1 and L9. These inductors L1 and L9 and a resistor R13 (56 ohms) in parallel connection with the latter make it possible to derive the desired low frequency component from the incoming wide-band signal without affecting its high frequency component. A resistor R14 (56 ohms) serves for terminating the transmission line for the low frequencies. For terminating the transmission line for higher frequencies, on the other hand, there is utilized the capacitance of the strip line in the vicinity of the coupling point between capacitor C1 and inductor L1.

The low frequency component of the input signal, separated from its higher frequency component as above, is first amplified by the inverting amplifier formed by the operational amplifier A1. The amplified signal has its level adjusted by a variable resistor R15 (two kohms) and then is delivered to the output line comprising a resistor R20 (78 ohms) and inductor L2 via the emitter follower composed of the transistors Q4 and Q5. The output from the DC amplifier 12 recombines with that from the wide-band AC amplifier 10 via the capacitor C. The inductor L2 functions as aforesaid to unite the amplified low frequency component with the amplified high frequency component without affecting the latter.

In the DC amplifier 12 resistors R16 (56 ohms) and R17 (2.4 kohms) serve to determine the gain of the operational amplifier A1. Resistors R18 (three kohms) and R19 (470 ohms) serve to determine the bias currents of the respective transistors Q4 and Q5. The wide-band AC amplifier 10 has three constant voltage power lines of +1 volt, designated +V1, and three constant voltage power lines of +12 volts, designated +V2. The DC amplifier 12 has a constant voltage power line of +15 volts, designated +V3, and a constant voltage power line of −15 volts, designated −V3.

In the circuit configuration of FIG. 2 the wide-band AC amplifier 10 allows easier bias setting, as used to provide a high gain, than in cases where DC amplifiers are employed for wide-band amplification. However, this amplifier is unsuitable for making sufficiently wide the range of frequencies to be processed, since the interstage capacitors C1, C2, C3 and C must be of large capacitance. These capacitors must also be of high quality, and capable of operation at high frequencies. Such capacitors are expensive. AC amplifiers in general require not only resistors and capacitors but also inductors for peaking. It is therefore difficult to make effective compensation for flat gain. It must also be pointed out that the insertion of capacitors and resistors for the prevention of oscillation in the signal path not only narrows the frequency range but also can cause oscillation and distortion due to signal reflection and increased capacitance by the electrodes.

The amplifier system of FIG. 2 will suffer little drift with temperatures because of the use of the operational amplifier A1 and the p-n-p and n-p-n transistors. It does, however, have a problem of waveform distortion at the crossover. The use of the resistor R13 and inductor L9 is insufficient to compensate for such distortion. Pulse distortion in the low band is an additional problem.

As is well known, the technique of negative feedback affords a stabler gain, a wider range of frequencies to be processed, a reduction in distortion, easier impedance control, and an improvement in signal-to-noise ratio. The March, 1981, issue of *Toshiba Review* (Vol. 36, No. 3) discloses an example of wide-band amplifier system based on the negative feedback scheme.

As reproduced in FIG. 3, this prior art system comprises three wide-band amplifiers A2, A3 and A4. Received by an input terminal IN, a wide-band signal to be amplified is directed into the first wide-band amplifier A2 via an adder circuit 14 on one hand and, on the other hand, into the second wide-band amplifier A3, connected in the feedback circuit, through its noninverting input terminal. The output from the second wide-band amplifier A3 enters the adder circuit 14, therein to be added to the input signal to be subsequently amplified by the first wide-band amplifier A2. The output from this amplifier A2 feeds a diode laser LD.

The output beam of the diode laser LD is split into two optical signals S1 and S2. The optical signal S1 is directed via a fiber connector 16 into an optical fiber 18 and, emerging from its distal end, impinges on a mirror 20. Reflected from this mirror as indicated at 22, the signal reenters the optical fiber 18 and is thereby transmitted back to the diode laser LD together with part of the signal 24 reflected from the proximal end of the optical fiber when the signal S1 enters the same. The other optical output signal S2 of the diode laser LD falls on a photodetector 26 such as a pin-photodiode thereby to be translated into an electrical signal. After being amplified by the third wide-band amplifier A4, the output from the photodetector 26 is directed into the second wide-band amplifier A3 through its inverting input terminal.

As may have been noted, the prior art system of FIG. 3 inversely feeds back the difference between the input signal and part of the output beam of the diode laser LD in order to remedy the problems of instability and nonlinear distortion due to wave reflections and modal noise, which problems would manifest themselves upon direct analog modulation of the diode laser. Typically the system has a complete loop gain of 16 dB and a bandwidth of 16 MHz and provides more than 16 dB improvement in noise level.

The FIG. 3 system has its own drawbacks, however. One is the high likelihood of oscillation because of the feedback of a broad band of frequencies. Another is expensiveness due mainly to the construction of the feedback circuit for the passage of the broad band of frequencies.

Figure 5:
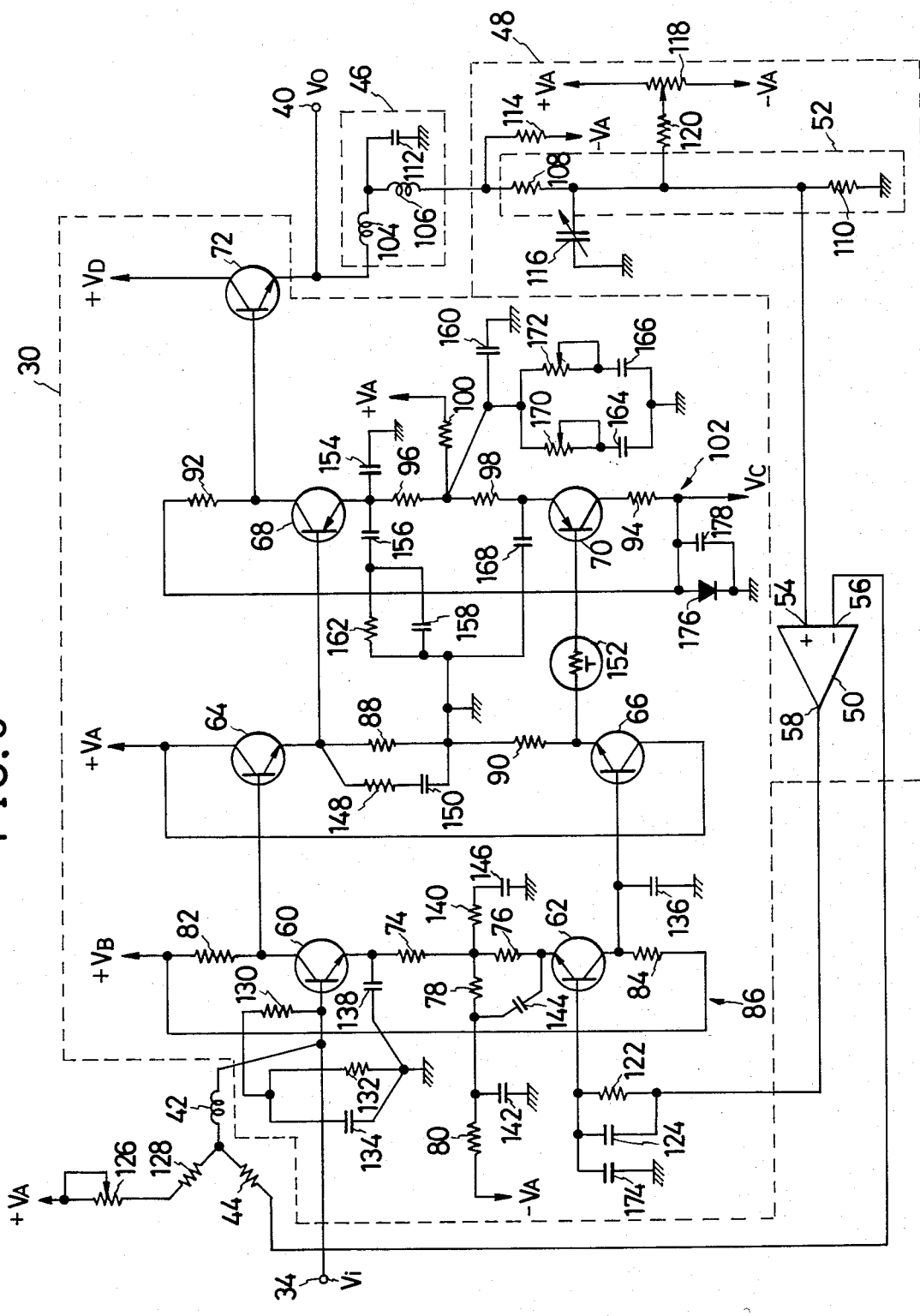
FIG. 5 is a schematic electrical diagram of the improved wide-band amplifier system constructed on the basis of the FIG. 4 configuration in accordance with our invention.
Figure 4:
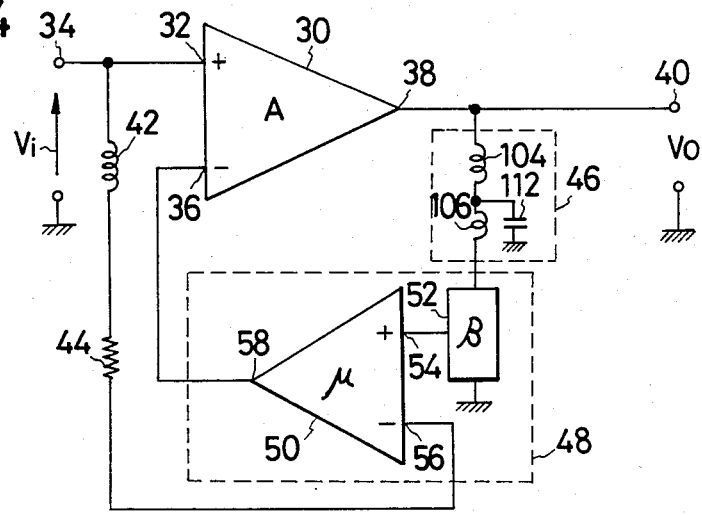
FIG. 4 is a block diagram explanatory of the basic configuration of the improved wide-band amplifier system embodying the principles of our invention.

We will now describe the wide-band amplifier system of our invention in terms of its preferable embodiment illustrated block-diagrammatically in FIG. 4 and in detail in FIG. 5. From FIG. 4 it will be seen that the inventive amplifier system broadly comprises:

1. A first amplifier circuit 30 having a first input 32 connected to a system input terminal 34, a second input 36, and an output 38 connected to a system output terminal 40.
2. An inductor 42 and resistor 44 connected to the system input terminal 34 and conjointly serving as a first low-pass filter.
3. An inductor circuit 46 connected to the output 38 of the first amplifier circuit 30 and serving as a second low-pass filter.
4. A second amplifier circuit 48 connected to receive the outputs from the first and second low-pass filters and having its output connected to the second input 36 of the first amplifier circuit 30.

The first amplifier circuit 30 receives through its first input 32 an input signal with a wide range of frequencies from zero (direct current) to a sufficiently high frequency maximum, which has been impressed to the system input terminal 34. Applied to the second input 36 of the first amplifier circuit 30 is a signal with a narrower band of frequencies from zero to a low-frequency maximum, as will be detailed subsequently. The first amplifier circuit 30 puts out a wide-band signal in response to the wide- and low-band input signals.

The second amplifier circuit 48 comprises a low- and narrow-band operational amplifier 50 and a gain setter circuit 52. The operational amplifier 50 has two inputs 54 and 56 and an output 58. The first or noninverting input 54 is connected to the gain setter circuit 52 and thence to the inductor circuit 46. The second or inverting input 56 is connected to the system input terminal 34 via the first low-pass filter comprising the inductor 42 and resistor 44. The output 58 is coupled directly to the second input 36 of the first amplifier circuit 30.

Thus, in the wide-band amplifier system of our invention broadly outlined above, the first amplifier circuit 30 receives through its second input 36 the difference between the low frequency component of the wide-band input signal, fed to its first input 32, and the low frequency component of its wide-band output signal. This scheme makes it possible to broaden the range of frequencies to be amplified and to reduce waveform distortion at low frequencies. It is also noteworthy that the operational amplifier 50 incorporated in the second amplifier circuit 48 can be of the narrow-band design handling only low frequencies, thus contributing to a reduction in the cost of the complete amplifier system.

Reference is now directed to FIG. 5 in order to discuss the details of this wide-band amplifier system. The first amplifier circuit 30 includes seven transistors designated 60 through 72 as in the drawing. Of these transistors the first 60, third 64 and seventh 72 are wide-band, low-noise n-p-n transistors. The second 62 and fourth 66 are low-band n-p-n transistors. The fifth 68 is a wide-band, low-noise p-n-p transistor. The sixth 70 is a low-band p-n-p transistor. Various constant voltage supply lines in the system are labeled as follows in accordance with the voltages supplied: $+V_A$, +12 volts; $-V_A$, −12 volts; $+V_B$, +9.02 volts; $V_C$, +0.18 volt; and $+V_D$, +2.17 volts.

The first transistor 60, having its base coupled to the input terminal 34 to receive the wide-band input signal, and the second transistor 62, having its base connected to the output 58 of the operational amplifier 50 in the second amplifier circuit 48 to receive the low-band feedback signal, are each an emitter-grounded amplifier. The emitters of these transistors 60 and 62 are interconnected via resistors 74 and 76 and further coupled to the negative supply line $-V_A$ via resistors 78 and 80 in series. Their collectors, on the other hand, are both coupled to the positive supply line $+V_B$ via respective resistors 82 and 84. Thus the first 60 and second 62 transistors constitute in combination a differential amplifier generally identified by the reference numeral 86.

It must be pointed out that the functioning of the pair of transistors 60 and 62 depends upon the frequencies of the signal being processed. As has been stated, the first transistor 60 is a wide-band one and the second 62 a low-band one. For the low band of input frequencies, therefore, they operate as a differential amplifier. The gain of the second transistor 62 decreases as the input frequency rises above the low band, until in the high frequency band the second transistor acts merely as a constant voltage source, connected via the resistors to the emitter of the emitter-grounded first transistor 60. In short the pair of transistors 60 and 62 function as differential amplifier in the low frequency band, from zero upward, and as emitter-grounded amplifier in the higher band of frequencies.

The third 64 and fourth 66 transistors have their bases coupled directly to the collectors of the first 60 and second 62 transistors respectively. The collectors of these transistors 64 and 66 are coupled directly to the positive supply line $+V_A$, and their emitters are grounded via respective resistors 88 and 90. Thus the transistors 64 and 66 constitute emitter-follower amplifiers, receiving the outputs from the collectors of the first 60 and second 62 transistors, respectively, for impedance change.

The fifth 68 and sixth 70 transistors have their bases coupled directly to the emitters of the third 64 and fourth 66 transistors respectively. The collectors of these transistors 68 and 70 are both coupled to the supply line $V_C$ via respective resistors 92 and 94. Their emitters are interconnected via resistors 96 and 98 and are further connected to the positive supply line $+V_A$ via a resistor 100. Consequently the pair of emitter-grounded amplifiers formed by the transistors 68 and 70 constitute in combination a second differential amplifier generally designated by the reference numeral 102.

As in the case of the first recited differential amplifier 86 formed by the pair of transistors 60 and 62, the pair of transistors 68 and 70 function as the differential amplifier only in the low frequency range. The fifth transistor 68 operates for a wide range of frequencies, whereas the sixth 70 operates for the low range only. For this reason the pair of transistors 68 and 70 coact as differential amplifier if the output from the preceding stage has frequencies in the low range. The gain of the sixth transistor 70 decreases as the input frequency rises beyond the low range, until in the high range the sixth transistor serves merely as a constant voltage source connected via the resistors to the emitter of the emitter-grounded fifth transistor 68. Then the transistors become emitter-grounded amplifier.

The seventh transistor 72 has its base coupled directly to the collector of the fifth transistor 68. Its collector is coupled to the positive supply line $+V_D$, and its emitter to the system output terminal 40. The transistor 72 is therefore an emitter-follower amplifier, used for impedance change.

Between the emitter of the seventh transistor 72 and ground there is connected a serial circuit of inductors 104 and 106 and resistors 108 and 110. The inductors 104 and 106 are parts of the inductor circuit 46, whereas the resistors 108 and 110 make up the gain setter circuit 52 included in the second amplifier circuit 48. Also included in the inductor circuit 46 is a capacitor 112 connected between ground and a point between the inductors 104 and 106.

The following is the description of the second amplifier circuit 48 also shown in detail in FIG. 5. In this second amplifier circuit a resistor 114 is inserted in the negative supply line $-V_A$ connected to a point between the inductor 39 of the inductor circuit 46 and the resistor 108 of the gain setter circuit 52. A variable capacitor 116 is connected between ground and a point between the resistors 108 and 110 of the gain setter circuit 52. Also a variable resistor 118 for level adjustment is connected via a resistor 120 to a point between the resistors 108 and 110. The opposite extremities of this variable resistor are coupled to the positive supply line $+V_A$ and to the negative supply line $-V_A$. The voltage dividing point between the resistors 108 and 110 is connected to the noninverting input 54 of the operational amplifier 50.

Configured as in FIG. 5 in accordance with the principles of our invention, the wide-band amplifier system affords the advantages of low drift and stability in performance characteristics. It is well known that the technique of negative feedback can reduce distortion, improve stability, and make gain uniform with respect to frequencies. These effects of negative feedback are even more pronounced in the invention amplifier system comprising the first amplifier circuit 30 having the unsymmetrical differential amplifiers 86 and 102, and the operational amplifier 50 for providing the resultant of the low-frequency component of the system input signal and the low-frequency component of the system output signal. The reasons for this will become apparent from the following continued discussion of FIG. 5.

In the circuit configuration of FIG. 5 the first 86 and second 102 differential amplifiers are not of symmetrical push-pull arrangment, being composed of the wide-band transistors 60 and 68 and the low-band transistors 62 and 70. It might be feared, therefore, that they would give rise to considerable distortion. Further, by reason of the difference in characteristics between the transistors 60 and 68 and the transistors 62 and 70, the currents flowing therethrough might not be of the same magnitude if their bias voltages and load resistances were the same. Consequently the transistors might have different power requirements, be thermally imbalanced, and thus provide a cause for drift. We provide a solution to this problem, as will become apparent from the subsequent paragraphs. Generally, in amplifiers, the power consumptions of the transistors vary with the input signal, so that their parameters are affected by temperatures. A difference in base-emitter voltage ($V_{BE}$) between paired transistors present a particular problem in differential amplifiers. Being related to thermal conduction, changes in $V_{BE}$ with temperatures can cause distortion over a frequency range from zero to several tens of kilohertz. In order to reduce a difference in power consumption between each pair of transistors, the operating point of the amplifier is usually placed centrally on the load line. However, the setting of the operating point with a view to only thermal balance restricts the efficient use of supply voltage. Also, in wide-band amplifiers, a parallel connection of resistor and capacitor is serially inserted in the signal path since an increase in load resistance reduces the band of frequencies processed. This makes it difficult to realize a wide-band amplifier having a bandwidth of 1 GHz or more, which our invention aims at.

The use of integrated circuitry is one known method of circumventing the thermal imbalance problem. This known method calls for the placement of the paired transistors close to each other, thereby efficiently coupling them together thermally. Even though the distortion of the output waveform may be reduced in a short time in this manner, the method provides no fundamental solution to the problem.

Our solution to the problem, then, is negative feedback through the operational amplifier 50. The second low-pass filter 46 derives the low frequency component from the output from the final-stage transistor 72 of the first amplifier circuit 30. Damped at a damping ratio $\beta$ by the resistors 40 and 41 of the gain setter circuit 52, the low-frequency component is directed to the non-inverting input 54 of the operational amplifier 50. The inverting input 56 of the operational amplifier receives the low-frequency component that has been derived from the system input signal by the first low-pass filter, comprising the inductor 42 and resistor 44, so as not to modify the high-frequency component of the wide-band input signal. The output from the operational amplifier 50 is applied to the base of the second transistor 62 via a parallel circuit of resistor 122 and capacitor 124.

Let Vi be the voltage of the input signal received by the input terminal 34 of the wide-band amplifier system, and Vo be the voltage of the output signal obtained by amplifying the input signal by the transistors 60–72 of the first amplifier circuit 30. The operational amplifier 50 inputs as aforesaid the low-frequency component of the output signal and the low-frequency component of the input signal, the former having been damped at the ratio $\beta$ by the gain setter circuit 52. Further, let A be the gain of the first amplifier circuit 30, and $\mu$ be the gain of the operational amplifier 50. If $0<\beta<1$, $1<A$, and $1\leq\mu$, then it follows that $$Vo \frac{(1 + \mu) A}{1 + \beta A \mu} Vi = \frac{1 + 1/\mu}{\beta + 1/A\mu} Vi \approx \frac{Vi}{\beta} \quad (2)$$

If A=10 and $\beta$=1/10, for example, then the complete wide-band amplifier system offers a voltage gain of 20 dB. Equation (2) does not hold true for the high frequency range because the operational amplifier 50 does not substantially take part in its amplification. It is therefore only the gain A of the first amplifier circuit 30 that determines that output voltage Vo for the high frequency range. The operational amplifier 50 does take part in the amplification of the low frequency band, so that the output voltage Vo is determined by Equation (2). It is thus seen that the gain of the amplifier system depends solely upon the gain A of the first amplifier circuit 11 for the high frequency band, and upon the damping ratio $\beta$ of the gain setter circuit 52 for the low frequency band. Consequently, if A is set as above at 10, and $\beta$ at 1/10, for example, the gain of the amplifier system can be made constant throughout the full range of frequencies.

Further, as long as Equation (2) holds true, the gain of the wide-band amplifier system can be stably maintained at $Vi/\beta$. Thus are the noted problems of thermal imbalance and distortion thoroughly overcome. Since the amplifier system dispenses with a large-capacitance capacitor for the compensation of the low frequency band, it lends itself to easy fabrication in the form of an integrated circuit. The drift of the amplifier system is largely affected by the stability of the operational amplifier 50 against drift. Experiment has proved that an ordinary operational amplifier can serve the purpose satisfactorily.

With reference again to FIG. 5 the DC level at the output terminal 40 of the amplifier system may change with variations in the base bias current of the first transistor 60 in the first amplifier circuit 30 due to fluctuations in its performance characteristics. In consideration of this possibility a 100-kohm variable resistor 126 is connected via a 5.6-kohm resistor 128 and the 60–80-nanohenry (nh) inductor 42 to the base of the transistor 60 for setting the zero DC output level. The DC level can also be set as desired by the variable resistor 118 in the second amplifier circuit 48 which is connected via the resistor 45 to the gain setter circuit 52, with the resistor 45 having sufficiently high resistance compared with those of the resistors 108 and 110. Given below by way of example are the bias levels of the transistors 60 through 72 when the input signal level is zero volt:

The collector voltage and collector current of the first transistor 60 are 7.8 V and 9.38 mA respectively. The collector voltage and collector current of the second transistor 62 are 7.6 V and 10.9 mA respectively. The emitter voltage of the third transistor 64 is 7.07 V. The emitter voltage of the fourth transistor 66 is 7.00 V. The collector voltage and current of the fifth transistor 68 are 0.79 V and 4.7 mA respectively. The collector voltage and current of the sixth transistor 70 are 1.92 V and 13.4 mA respectively. The emitter voltage of the seventh transistor 72 is 0.06 V.

We will now explain gain compensation and frequency-response compensation in the wide-band amplifier system of FIG. 5. Connected to the system input terminal 34, a transmission line (not shown) with a characteristic impedance of 50 ohms is terminated by a 47-ohm resistor 130 connected to the input terminal, and a parallel circuit of 4.7-ohm resistor 132 and 47-pF capacitor 134 connected between resistor 130 and ground. The wide-band input signal received by the input terminal 34 is first amplified by the first differential amplifier 86 comprising the transistors 60 and 62. Further including the 12-ohm resistors 74 and 76, 130-ohm resistor 82 and 130-ohm resistor 84, the first differential amplifier 86 offers a gain of approximately 13.4 dB.

A 33,000-pF capacitor 136, connected between the collector of the second transistor 62 and the base of the fourth transistor 66, functions as a low-pass filter that determines the upper limit of the frequencies from the collector of the second transistor. This makes it easier to compensate for the gain and frequency response, especially at the crossover, of the complete amplifier system by making the output frequency band of the second transistor 62 equivalent to the band where Equation (2) applies. The operational amplifier 50 serves to stabilize signal amplification in the low frequency band where Equation (2) applies. For signal amplification in the high frequency band where Equation (2) does not apply, on the other hand, there are employed the wide-band transistors 60, 64, 68 and 72.

Connected between the emitter of the first transistor 60 and ground, a 3-pF capacitor 138 is intended for high frequency response compensation. For frequency response compensation in a relatively high frequency band, and for compensation of the crossover of the low and high frequency bands, there are provided 51-ohm resistors 78 and 140, 22-pF capacitor 142, 20-pF capacitor 144, and 470-pF capacitor 146, which are connected as drawn. The transient response of the operational amplifier 50 also takes part in the crossover compensation, as will be later explained in further detail.

The resistors 88 and 90 connected between the emitters of the second pair of transistors 64 and 66 are both of one kohm. Also connected to the emitter of the transistor 64, in parallel with the resistor 88, a series circuit of a 150-ohm resistor 148 and 1-pF capacitor 150 acts as a filter as in the case of high frequency waveform linking, eliminating undesired phenomena such as oscillation and contributing to frequency response compensation in the high range.

The fifth transistor 68, making up the second differential amplifier 102 in combination with the sixth transistor 70, has its base coupled directly to the emitter of the third transistor 64 to be fed thereby. The sixth transistor 70, on the other hand, has its base coupled to the base of the fourth transistor 66 via a 150-ohm thermistor 152. This thermistor is intended for compensation for distortion due to the temperature-dependent variations in the base-to-emitter voltage $V_{BE}$ of the transistors. In this wide-band amplifier system the changes in $V_{BE}$ of the transistor 62 in particular adversely affect frequency response at the crossover of the low and high frequency bands, so that compensation by the thermistor is very effective.

Comprising the 22-ohm resistors 96 and 98 and 130-ohm resistors 92 and 94, the second differential amplifier 102 provides a gain of approximately 11 dB. A 2-pF capacitor 154, 4-pF capacitor 156, 1000-pF capacitor 158, 6-pF capacitor 160, and 10-ohm resistor 162 are for high frequency response compensation. A 4700-pF capacitor 164, 270-pF capacitor 166, 12-pF capacitor 168, and 100-ohm variable resistors 170 and 172 are for frequency response compensation in a relatively high band.

The seventh transistor 72 has its emitter coupled directly to the output terminal 40 of the amplifier system. This output terminal is intended for direct connection to a coaxial cable, not shown, with a characteristic impedance of 50 ohms. Alternatively the output terminal may be connected to a strip transmission line with a characteristic impedance of 50 ohms.

The output signal from the transistor 72 has a frequency bandwidth of as much as over 1 GHz. For minimizing undesired effects on this output signal the current bias resistor 114 of 360 ohms is connected to the emitter of the transistor 72 via the inductor circuit 46 comprising the 30-nh inductor 104, 20-nh inductor 106, and 2-pF capacitor 112. The 18-kohm resistor 108 and two-kohm resistor 110 of the gain setter circuit 52 serve for the attenuation of the output signal. Should the transient response of the operational amplifier 50 on the feedback path have ringing or overshoot, the gain and frequency response of this amplifier system would deteriorate. Serving for the transient response compensation of the operational amplifier are the 5-pF variable capacitor 116, 470-ohm resistor 122, 150-pF capacitor 124, and 47-pF capacitor 174.

There might be contemplated two possible causes for drift in the wide-band amplifier system. One is fluctuations in the offset voltage of the operational amplifier 50. The other is variations in the base current of the first transistor 60. However, as for the former, usual operational amplifiers available today are sufficiently stabilized to avoid such offset voltage fluctuations. The base current variations of the first transistor 60, on the other hand, are negligibly small.

For balancing the offset voltage of the operational amplifier 50 the resistance of the resistor 44, at 1.8 kohms, is made equal to the parallel resistance of the 18-kohm resistor 108 and two-kohm resistor 110 of the gain setter circuit 52. The lines including the 510-ohm resistor 80 and 220-ohm resistor 100 may be replaced by constant current sources.

The seventh transistor 72 functioning as an emitter follower is biased to have a collector-emitter voltage of approximately 2.2 V. The low setting of the collector-emitter voltage is desirable for the prevention of oscillation, provided that it does not interfere with the proper functioning of the transistor as an emitter follower. The second, low-band transistor 62 responds to higher frequencies than does the sixth, low-band transistor 70. Emitter followers in general have an output impedance of less than 50 ohms. The output DC resistance of the seventh transistor 72 is about 40 ohms, so that a resistor or attenuator may be inserted between the system output terminal 40 and the junction between the emitter of the transistor 72 and the inductor 104. This is because, connected to the output terminal 40, the coaxial cable with a characteristic impedance of 50 ohms may give rise to distortion or oscillation if poorly terminated.

Our invention allows the cascading of a plurality of amplifiers each constructed as taught herein. It will also be appreciated that the noninverting design of the amplifier system in accordance with our invention permits easy gain control. This is because the signal is not inverted regardless of whether the amplifier stages are odd- or even-numbered.

Let us consider amplifiers of the type wherein the collector of a transistor provides the output signal. If the load resistance of the collector were set at 51 ohms to match the 50-ohm impedance of the coaxial cable connected thereto, the impedance as taken from the collector would be about 25 ohms. Thus, if the collector load resistance of the fifth transistor 68 in the amplifier system of our invention were set at 51 ohms in consideration of the 50-ohm coaxial cable, the collector load would substantially become so small that a sufficient gain would not be obtained.

Contrastively, in the wide-band amplifier system of FIG. 5, the emitter-follower amplifiers are interposed between the grounded-emitter amplifiers for impedance change. This configuration offers two advantages. One is that the load resistance of the amplifier system can be set higher than in the case where two emitter-grounded amplifier stages are directly coupled together, thus providing greater gain per stage. The load resistance of the amplifier system in accordance with our invention is set at 130 ohms, compared with about 50 to 100 ohms of usual wide-band amplifiers. In order to maintain its improved performance, the inventive system can be embodied in a hybrid integrated circuit such that the signal input and output sections of the wide-band transistors float from the substrate. The low-band transistors 62, 66 and 70 of the first amplifier circuit may take the form of inexpensive molded-plastic transistors, and the inductors 42, 104 and 106 may be fabricated by use of polyurethane-coated wire with a diameter of 0.1 millimeter.

The other advantage is the isolation effect offered by the emitter followers as buffer amplifiers. This reduces interference among the amplifying transistors, enhances the stability of the complete amplifier system, and makes frequency response compensation easier.

The above and other advantages and features of our invention combine to make possible the provision of a wide-band amplifier system having a voltage gain of 20 dB and a bandwidth ranging from zero to 1.8 GHz.

Discussed hereinbelow is the overload problem. Negative feedback loops incorporated in amplifiers in general may cause oscillation depending upon the quantity fed back and the signal phase, as is frequently the case in the high frequency range of the signal being fed back. No such oscillation takes place in the improved amplifier system of our invention, because it feeds back only low frequencies from zero up to, say, 100 kHz. In the use of an operational amplifier as in the second amplifier circuit 48 of our invention, a phenomenon similar to the latch-up of complementary metal-oxide semiconductor (CMOS) devices might occur, such that the operational amplifier would saturate when an excessive input placed the amplifier system out of its linearly operating range. Even after the input had become normal, the bias levels of the transistors would remain altered. The amplifier system would regain normal operation only by temporarily switching off its power supply.

For the solution of this problem the illustrated embodiment employs a diode 176 and 1-$\mu$F capacitor 178 connected between ground and the collector-biasing power supply for the transistors 68 and 70. In the absence of these diode and capacitor, an excessive input to the amplifier system would cause a change in the constant current characteristic of the second differential amplifier 102 formed by the transistors 68 and 70, and the potential of the constant voltage supply line $V_C$, determined by a parallel resistance-capacitance circuit, not shown, would become high. Then one of the transistors 68 and 70 would become nearly completely off, and the other on. The diode 176 prevents this. The differential amplifier 102 will have its operating level unchanged, even though its constant current characteristic may slightly change, if then the diode 176 functions to maintain its anode-side potential at approximately 0.6 V. Thus the amplifier will return to normal operation when the input signal regains its normal level.

With its operation stabilized as above without affecting its high frequency characteristic, the wide-band amplifier system of our invention will have its output limited to a range from about 1.6 V at a maximum to −0.8 V, as computed from the fact that the constant current flowing through the 220-ohm resistor 100 is about 18 mA. These values agree with the results of experimentation. Connected in parallel with the diode 176, the capacitor 178 has a capacitance of 1 $\mu$F and serves to offer low impedance to a relatively high frequency component of the input signal. It will have been seen that our invention succeeds in the provision of a wide-band, low-drift, high-stability amplifier system.

Generally, in a differential amplifier composed of a pair of wide-band transistors, the floating capacitance between the emitter of each transistor and ground must be reduced to prevent oscillation. Also, for wide-band step response, the distance between the emitters of the transistors must be minimized to reduce the emitter inductance. In a single-input wide-band amplifier, moreover, even if the two emitters are directly coupled together, an amplification of a steeply rising input pulse results in the appearance, in the collector output, of two superposed pulses having different rise times. One of them is a steeply rising pulse due to the transistor closer to the signal input, and the other is a less steeply rising pulse due to the other transistor farther away from the input. This causes a delay in overall rise time and limits the high frequency response of the amplifier.

This problem is totally absent from the wide-band amplifier system of our invention as its differential amplifiers 86 and 102 are comprised of the wide-band amplifiers 60 and 68 and low-band amplifiers 62 and 70. By reducing the gains and bandwidths of the low-band amplifiers as far as practical, the amplifier system will put out only the aforesaid steeply rising pulses. Thus the amplifier system has a flat gain and frequency characteristic over a broad range of frequencies.

The wide-band amplifier system of our invention also possesses the advantage of having only half as many wide-band transistors as those in conventional push-pull amplifiers. Further the inventive system requires a reduced number of components designed for wide band signal processing. The consequently simplified configuration of the inventive system makes it suitable for fabrication in the form of an integrated circuit.

The observation of optical signals, one of the possible applications of our invention, requires a high-gain, low-drift, wide-band amplifier. Such an amplifier is easy to realize by cascading a plurality of amplifier stages each configured as shown in FIG. 5, since the illustrated amplifier system is noninverting. The multistage amplifier system so constructed will have a gain of 40 or even 60 dB.

The invention further solves the problem of drift due to thermal imbalance in ordinary wide-band amplifiers, and of distortion and crossover gain compensation in known composite amplifiers incorporating a narrow-band DC amplifier and a wide-band AC amplifier. This is because the use of the operational amplifier in the feedback path affords stable operation in the low frequency band where its gain is sufficiently high, resulting in the reduced distortion, improved linearity and stabilized gain of the amplifier system.

The fact that the differential amplifiers in the amplifier system of our invention are not of symmetrical push-pull configuration might be a possible cause of distortion. This is not so. The performance of the inventive amplifier system is satisfactory for all practical purposes because of the improved results of negative feedback through the operational amplifier 50. Theoretically, the distortion of the inventive system is reduced to approximately $1/\mu$, so that it presents no problem in practice. As regards distortion and crossover compensation, the resistance of the constant current circuit in FIG. 5 is divided into the resistors 78 and 80, and the capacitors 142 and 144 are used for compensation. Further, unlike the prior art composite amplifier, the inventive system needs no inductors in the feedback path for high frequency compensation, and its transistors can be coupled together with minimum lengths of signal paths. For these reasons, too, the inventive system allows easy frequency and gain compensation and can pass a wide range of frequencies with substantially uniform amplification.

The inventive system might be considered similar to the prior art system of FIG. 3 in having an amplifier in the feedback path. The two systems completely differ in the principles of operation, and, therefore, in construction. The prior art system feeds back the full band of frequencies, whereas the inventive system feeds back only the low band. The wide-band feedback theory of the prior art system requires the use of the wide-band amplifiers A3 and A4 on the feedback path, making the amplifier system expensive. The feedback of the wide frequency band also tends to give rise to oscillation depending upon the quantity of the signal being fed back and on its phase, and particularly in the event of phase displacement. The low-band feedback principle of our invention, on the other hand, allows the use of usual high-gain, low-drift operational amplifiers, such as those with a gain-bandwidth product of less than 3 MHz or so, as the amplifier 12 on the feedback path. The high gain and stability of this operational amplifier can be effectively utilized to improve the overall performance of the amplifier system.

Figure 6:
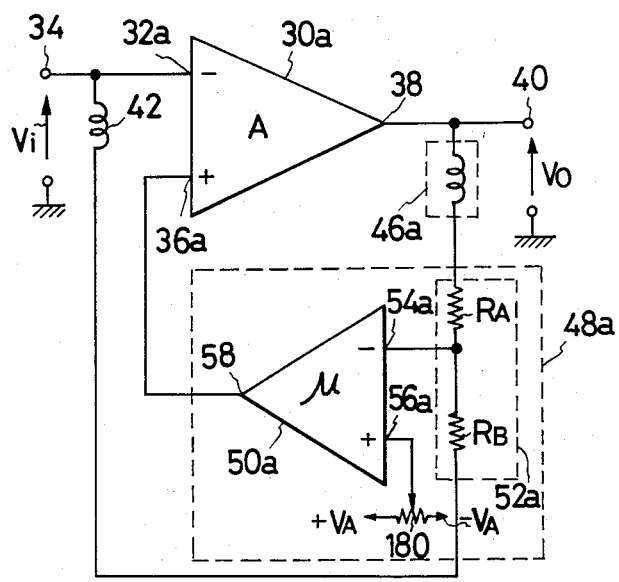
FIG. 6 is a diagram similar to FIG. 4 but showing an alternative form of the wide-band amplifier system in accordance with our invention.

FIG. 6 is a block diagrammatic illustration of an alternative form of the wide-band amplifier system in accordance with our invention. The alternative amplifier system differs from the preceding embodiment in having a first amplifier circuit 30a of the inverting design. However, the first amplifier circuit 30a also covers a wide range of frequencies from zero to a sufficiently high frequency maximum and is essentially similar in circuit configuration to the circuit 30 of the first disclosed embodiment, comprising an unsymmetrical differential amplifier as set forth hereinbelow in more detail.

The inverting first amplifier circuit 30a comprises the first and second grounded-emitter transistors 60 and 62 of FIG. 5 in cascode connection with the third and fourth transistors 64 and 66. The third and fourth transistors have their bases grounded and their emitters coupled to the collectors of the first stage transistors 60 and 62. The third transistor 64 has its collector coupled to the base of the final-stage transistor 72.

Other circuit configurations are of course adoptable for the inverting first amplifier circuit 30a. An example is to employ a different number of differential amplifiers. It is also possible to insert a cascode amplifier, comprising a grounded-emitter transistor and grounded-base transistor, between the third and fourth transistors 64 and 66 and the fifth and sixth transistors 68 and 70.

The second amplifier circuit 48a of the FIG. 6 system is also slightly modified. Included in this second amplifier circuit, an operational amplifier 50a, which is a high-gain, high-stability amplifier covering a narrow frequency band from zero to a low-frequency maximum, has its first input 54a coupled, on one hand, to the system input terminal 34 via a resistor RB and a first low-pass filter formed by the inductor 42 and, on the other hand, to the output 38 of the first amplifier circuit 30a via a resistor RA and a second low-pass filter 46a formed by an inductor. The resistors RA and RB constitute in combination a gain setter circuit 52a. The other input 56a of the operational amplifier 50a is coupled directly to a variable resistor 180 for setting its DC level. The output 58 of the operational amplifier 50a is coupled to the input 36a of the first amplifier circuit 30a, the other input 32a of which is connected to receive the input signal from the system input terminal 34. The output 38 of the first amplifier circuit 30a is of course coupled to the system output terminal 40.

Such being the configuration of the alternative wide-band amplifier system in accordance with our invention, it will be seen that the operational amplifier 50a of the second amplifier circuit 48a inputs the sum of the low-frequency components of the wide-band input and output signals of the first amplifier circuit 30a, as combined through the resistors RA and RB, for negative feedback control of the first amplifier circuit.

Let us assume that the gain A of the first amplifier circuit 30a is more than one, that the gain $\mu$ of the operational amplifier 50a is much greater than one, and that the relative resistances RB/RA and RA/RB are both much less than $\mu$. Then, as in the case of the FIGS. 4 and 5 embodiment, the following equation is established:

$$Vo = - \frac{RA\left\{1 + \frac{1}{\mu}\left(1 + \frac{RB}{RA}\right)\right\}}{RB\left\{1 + \frac{1}{\mu A}\left(1 + \frac{RA}{RB}\right)\right\}} Vi \qquad (3)$$

$$\doteq - \frac{RA}{RB} Vi$$

It is therefore the relative resistances of the resistors RA and RB that determine the low-band gain of the wide-band amplifier system. The operational amplifier 50a is unresponsive to higher frequencies, so that only the gain A of the first amplifier circuit 30a decides the high-band gain of the amplifier system. Consequently, by adjusting the low-band gain to the high-band gain, the amplifier system will have an approximately constant gain for the full frequency band from zero to a sufficiently high frequency maximum. Its additional advantages are as set forth above in connection with the preceding embodiment.

While we have shown and described the wide-band amplifier system of our invention in terms of what we have conceived to be the most practical and preferable forms, we realize, of course, that modifications and variations of such specific embodiments will readily occur to electronics specialists. The following is a list of typical ones of such possible modifications and variations:

1. The fifth transistor 68 of the p-n-p type in the first amplifier circuit 30 of FIG. 5 may be replaced by an n-p-n transistor. It is principally the gain-bandwidth product of this p-n-p transistor 68 that determines the upper limit of frequencies passed by the FIG. 5 system. Since n-p-n transistors respond to a wider frequency band than do p-n-p transistors, the replacement of the p-n-p transistor 68 with one of the n-p-n type will further widen the frequency band of the amplifier system.
2. The transistors 60 and 68 in the first amplifier circuit 30 need not be of the illustrated grounded-emitter configuration. They may be provided with inductance-capacitance-resistance voltage feedback circuits such as those provided to the transistors Q1 and Q2 in the prior art system of FIG. 2.
3. Not bipolar transistors 60, 62, 68 and 70 but field-effect transistors may be adopted to make up the differential amplifiers 86 and 102.
4. The input 34 and output 40 terminals of the wide-band amplifier system may be connected to transmission lines with a characteristic impedance of other than 50 ohms, such as those with a 75-ohm impedance.
5. The diode 176 and capacitor 178 would be unnecessary if the supply line $V_C$ were at ground potential.
6. The first amplifier circuit 30 may be modified into one of the composite type, comprising high- and low-band amplifiers as in the prior art system of FIG. 1, with the sum of, or the difference between, the low-frequency components of the system input and output signals directed into the low-band amplifier.
7. The inductors 42, 104 and 106 of FIG. 5 may not necessarily be in the illustrated positions but may be used elsewhere in the signal paths.

All these and other changes of the illustrated embodiments are intended in the foregoing disclosure; therefore, our invention is to be limited only by the terms of the following claims.

We claim:

1. A wide-band amplifier system capable of amplifying frequencies from zero to a sufficiently high frequency maximum with essentially constant gain, comprising:
   (a) input means for receiving an input signal having a wide band of frequencies from zero upward;
   (b) a first amplifier circuit having a first input connected to the input means for receiving the wide-band input signal therefrom, a second input for receiving a low-band input signal having frequencies from zero to a relatively low frequency maximum, and an output for producing an amplified wide-band output signal in response to the wide- and low-band input signals;
   (c) a first low-pass filter connected to the input means for deriving a low-frequency component from the wide-band input signal;
   (d) a second low pass filter connected to the output of the first amplifier circuit for deriving a low-frequency component from the wide-band output signal;
   (e) a second amplifier circuit for producing the low-band signal, for delivery to the second input of the first amplifier circuit, from the difference between the low-frequency components of the wide-band input and output signals, the second amplifier circuit comprising:
      (1) a gain setter circuit connected to the second low-pass filter; and
      (2) an operational amplifier having a first input connected to the gain setter circuit, a second input connected to the first low-pass filter, and an output connected to the second input of the first amplifier circuit; and
   (f) output means connected to the output of the first amplifier circuit.

2. The wide band amplifier system of claim 1 wherein the first amplifier circuit comprises:
   (a) a first differential amplifier comprising:
      (1) a first transistor having a base coupled to the first input of the first amplifier circuit; and
      (2) a second transistor having a base coupled to the second input of the first amplifier circuit;
   (b) a first emitter-follower amplifier comprising:
      (1) a third transistor having a base coupled to the collector of the first transistor;
   (c) a second emitter-follower amplifier comprising:
      (1) a fourth transistor having a base coupled to the collector of the second transistor;
   (d) a second differential amplifier comprising:
      (1) a fifth transistor having a base coupled to the emitter of the third transistor; and
      (2) a sixth transistor having a base coupled to the emitter of the fourth transistor; and
   (e) a third emitter-follower amplifier comprising:
      (1) a seventh transistor having a base coupled to the collector of the fifth transistor.

3. A wide-band amplifier system capable of amplifying frequencies from zero to a sufficiently high frequency maximum with essentially constant gain, comprising:
   (a) input means for receiving an input signal having a wide band of frequencies from zero upward;
   (b) a first amplifier circuit having a first input connected to the input means for receiving the wide-band input signal, a second input for receiving a low-band input signal having frequencies from zero to a relatively low frequency maximum, and an output for producing an amplified wide-band output signal in response to the wide- and low-band input signals, the first amplifier circuit comprising:
      (1) a first differential amplifier comprising a first transistor having a base coupled to the first input of the first amplifier circuit, and a second transistor having a base coupled to the second input of the first amplifier circuit;
      (2) a first emitter-follower amplifier comprising a third transistor having a base coupled to the collector of the first transistor;
      (3) a second emitter-follower amplifier comprising a fourth transistor having a base coupled to the collector of the second transistor;
      (4) a second differential amplifier comprising a fifth transistor having a base coupled to the emitter of the third transistor, and a sixth transistor having a base coupled to the emitter of the fourth transistor; and
      (5) a third emitter-follower amplifier comprising a seventh transistor having a base coupled to the collector of the fifth transistor;
   (c) a first low-pass filter connected to the input means for deriving a low-frequency component from the wide-band input signal;

(d) a second low-pass filter connected to the output of the first amplifier circuit for deriving a low-frequency component from the wide-band output signal;

(e) a second amplifier circuit connected to the first and second low-pass filters for producing the low-band signal, for delivery to the second input of the first amplifier circuit, as a resultant of the low-frequency components of the wide-band input and output signals; and (f) output means connected to the output of the first amplifier circuit.

4. The wide-band amplifier system of either of claims 2 or 3, wherein the first, third, firth and seventh transistors of the first amplifier circuit are wide-band transistors and the second, fourth and sixth transistors are low-band transistors.

5. The wide-band amplifier system of either of claims 2 or 3, wherein the first amplifier circuit further comprises a low-pass filter connected between the collector of the second transistor and the base of the fourth transistor.

6. The wide-band amplifier system of either of claims 2 or 3, wherein the first amplifier circuit further comprises bias means connected to the base of the first transistor for setting the DC level thereof.

7. The wide-band amplifier system of either of claims 2 or 3, wherein the first amplifier circuit further comprises a thermistor connected between the emitter of the fourth transistor and the base of the sixth transistor.

8. The wide-band amplifier system of either of claims 2 or 3, wherein the first amplifier circuit further comprises a diode connected between ground and a collector biasing power supply for the fifth and sixth transistors.

9. The wide-band amplifier system of either of claims 1 or 3, wherein each of the first and second low-pass filters comprises an inductor.

* * * * *